(12) United States Patent
Shan et al.

(10) Patent No.: US 8,703,547 B2
(45) Date of Patent: Apr. 22, 2014

(54) THYRISTOR COMPRISING A SPECIAL DOPED REGION CHARACTERIZED BY AN LDD REGION AND A HALO IMPLANT

(75) Inventors: Yi Shan, Shanghai (CN); Jun He, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 466 days.

(21) Appl. No.: 12/812,852

(22) PCT Filed: Dec. 22, 2008

(86) PCT No.: PCT/CN2008/002041
§ 371 (c)(1),
(2), (4) Date: Jul. 14, 2010

(87) PCT Pub. No.: WO2009/092188
PCT Pub. Date: Jul. 30, 2009

(65) Prior Publication Data
US 2011/0121361 A1    May 26, 2011

(30) Foreign Application Priority Data
Dec. 21, 2007  (CN) .......................... 2007 1 0172752

(51) Int. Cl.
*H01L 21/332*    (2006.01)
(52) U.S. Cl.
USPC ................... 438/133; 257/173; 257/E29.211; 257/E29.224; 257/E29.225; 257/E21.388; 257/E21.389

(58) Field of Classification Search
USPC ........... 257/173, E29.211, E29.224, E29.225, 257/E21.388, E21.389, E21.39; 438/133
See application file for complete search history.

(56) References Cited

U.S. PATENT DOCUMENTS

| 5,856,214 A | * | 1/1999 | Yu .................................. 438/133 |
| 6,563,176 B2 | | 5/2003 | Gauthier, Jr. et al. |
| 2008/0253046 A1 | * | 10/2008 | Lou et al. ........................ 361/56 |

FOREIGN PATENT DOCUMENTS

| CN | 1490873 A | 4/2004 |
| CN | 101211968 A | 7/2008 |
| EP | 0717448 A1 | 6/1996 |

* cited by examiner

*Primary Examiner* — Tom Thomas
*Assistant Examiner* — Christopher M Roland

(57) ABSTRACT

The present invention provides a device for electrostatic discharge and the method of manufacturing thereof. P-well is formed on the substrate, and a first $N^+$ doped region, a second $N^+$ doped region and a $P^+$ doped region are formed in the P-well; both ends of each doped region adopt shallow trench isolation for isolation. A lightly doped source-drain region portion is formed between the first $N^+$ doped region and the shallow trench isolation connected thereto. Under the source-drain region, a halo injection with an inverse type is formed. The reverse conduction voltage of the collector of the bipolar transistor is lowered through the introduction of special doped region and the adoption of lightly doped source-drain technology for manufacturing the source-drain region as well as the manufacturing of halo injection with inverse type under the source-drain region, thus reducing the trigger voltage of the device.

4 Claims, 5 Drawing Sheets

US 8,703,547 B2

THYRISTOR COMPRISING A SPECIAL DOPED REGION CHARACTERIZED BY AN LDD REGION AND A HALO IMPLANT

BACKGROUND OF THE INVENTION

1. Technical Field

The present invention relates to the field of electrostatic protection circuit design, and more specifically, to the structure of bipolar transistor and thyristor (or known as Silicon-controlled Rectifier) in electrostatic protection circuit and the method of manufacturing the same.

2. Description of Related Art

Electrostatic discharge (known as ESD) is an event frequently occurred to integrated circuit chip. The quantity of electrical charge from this event may be transferred into the integrated circuit through the I/O pin of the integrated circuit chip within a very short period, which may damage the internal circuit of the integrated circuit. To solve this problem, a protection circuit is generally mounted between internal circuit and I/O pin. The protection circuit is activated before the pulse arrives at the internal circuit and rapidly eliminates the over high voltage to avoid the damage caused by the ESD event.

Refer to FIG. 1 and FIG. 2 for the structures of a typical discharge cell bipolar transistor and a thyristor in electrostatic protection circuit.

PRIOR ART I

FIG. 1 shows the structure of a typical discharge cell bipolar transistor in electrostatic protection circuit. P-well 200 is formed on the substrate 100, wherein a first $N^+$ doped region 115, a second $N^+$ doped region 114 and a $P^+$ doped region 113 each connected to an input node NI are further formed in the P-well 200. The second $N^+$ doped region 114 is located in between the first $N^+$ doped region 115 and the $P^+$ doped region 113. Both ends of each doped region adopt shallow trench isolation for isolation. The bipolar transistor is an NPN bipolar transistor, the first $N^+$ doped region 115 being the collector of the NPN transistor, the second $N^+$ doped region 114 being the emitter of the NPN transistor, the $P^+$ doped region 113 being the base of the NPN transistor. An output node NO is adjacent to the first $N^+$ doped region 115.

PRIOR ART II

FIG. 2 shows the structure of a typical discharge cell thyristor in electrostatic protection circuit. A bipolar PNP transistor $T_1$ and a bipolar NPN transistor $T_2$ are formed on the substrate 1. Firstly, N-well 2 and P-well 3 are formed on the substrate 1, and then $N^+$ doped region 51 and $P^+$ doped region 61 are formed in the N-well 2. $N^+$ doped region 51 is used as the lead-out area of the base for $T_1$, $P^+$ doped region 61 is used as the emitter of $T_1$, wherein $N^+$ doped region 51 and $P^+$ doped region 61 are isolated by shallow trench isolation 4. $N^+$ doped region 52 and $P^+$ doped region 62 are formed in the P-well 3. $N^+$ doped region 52 is used as the emitter of $T_2$, $P^+$ doped region 62 is used as the base lead-out area of $T_2$, wherein $N^+$ doped region 52 and $P^+$ doped region 62 are isolated by shallow trench isolation 4. Shallow trench isolation 4 is also used between the N-well and the P-well to isolate the emitter of $T_1$ and the emitter of $T_2$.

For the structures of discharge cells shown in FIG. 1 and FIG. 2, electrostatic discharge voltage is required to trigger the PN junction of the collector of $T_1$ for reverse conduction, so as to trigger the turn-on of the entire discharge cell, thus leading to high trigger voltage of the discharge cell, namely, only ESD event having high discharge voltage can facilitate the turn-on of the discharge cell, otherwise, when the pulse of some ESDs is not high, the discharge cell is not turned on, however, some vulnerable components of the integrated circuit chip have already been damaged.

SUMMARY OF THE INVENTION

The present invention aims at providing a new device for electrostatic discharge and the method of manufacturing the same so as to solve the problem of IC chip internal elements damage due to the high trigger voltage of conventional discharge bipolar transistor and thyristor.

To realize the purpose above, the present invention provides a method of manufacturing a device for electrostatic discharge, wherein the device is a bipolar transistor, the method comprising the following steps: form a P-well on the substrate; form a first $N^+$ doped region, a second $N^+$ doped region and a $P^+$ doped region in the P-well, wherein the second $N^+$ doped region is located in between the first $N^+$ doped region and $P^+$ doped region, both ends of each doped region adopt shallow trench isolation for isolation, wherein, a lightly doped source-drain region portion is formed between the first $N^+$ doped region and the shallow trench isolation connected thereto by using lightly doped source-drain technology, and a halo injection with inverse type of the lightly doped source-drain region is formed beforehand under the lightly doped source-drain region.

Alternatively, the bipolar transistor is an NPN bipolar transistor; the first $N^+$ doped region is as the collector of the NPN transistor, the second $N^+$ doped region is as the emitter of the NPN transistor and the $P^+$ doped region is as the base of the NPN transistor.

Alternatively, N-type lightly doped source-drain region portion is formed in the P-well by using N-type lightly doped source-drain technology, wherein P-type halo injection is formed under the N-type lightly doped source-drain region.

The present invention also provides a device for electrostatic discharge, wherein the device is a bipolar transistor, the device comprising: a P-well, formed on a substrate; a first $N^+$ doped region, a second $N^+$ doped region and a $P^+$ doped region, formed in the P-well, the second $N^+$ doped region being located in between the first $N^+$ doped region and the $P^+$ doped region, both ends of each doped region adopting shallow trench isolation for isolation, wherein, a lightly doped source-drain region portion is formed between the first $N^+$ doped region and the shallow trench isolation connected thereto, and a halo injection with inverse type of the lightly doped source-drain region is formed under the lightly doped source-drain region.

Alternatively, the bipolar transistor is an NPN bipolar transistor; the first $N^+$ doped region is as the collector of the NPN transistor; the second $N^+$ doped region is as the emitter of the NPN transistor and the $P^+$ doped region is as the base of the NPN transistor.

Alternatively, N-type lightly doped source-drain region portion is formed in the P-well by using N-type lightly doped source-drain technology, and a P-type halo injection is formed under the N-type lightly doped source-drain region.

Moreover, the present invention also puts forward a method of manufacturing a device for electrostatic discharge, wherein the device is a thyristor, the method of manufacturing comprising: form an N-well and a P-well on a substrate; form an $N^+$ doped region and a $P^+$ doped region both in the N-well and in the P-well; isolate the doped regions by shallow trench isolation; form a special doped region between the N-well and the P-well, the special doped region being isolated from the doped regions in the N-well and the P-well by shallow trench isolation, wherein, a lightly doped source-drain region portion of the special doped region is formed in the well with inverse type of the special doped region by using lightly doped source-drain technology, and a halo injection with the inverse type of the lightly doped source-drain region is formed beforehand under the lightly doped source-drain region.

Alternatively, the thyristor is composed of a PNP and an NPN bipolar transistor; the $N^+$ doped region in the N-well is as the base of the PNP transistor and the collector of the NPN transistor; the $P^+$ doped region in the P-well is as the base of the NPN transistor and the collector of the PNP transistor; the $P^+$ doped region in the N-well is as the emitter of the PNP transistor; the $N^+$ doped region in the P-well is as the emitter of the NPN transistor.

Alternatively, the special doped region between the N-well and the P-well is an $N^+$ doped region; an N-type lightly doped source-drain region portion of the special doped region is formed in the P-well by using N-type lightly doped source-drain technology; a P-type halo injection is formed under the N-type lightly doped source-drain region.

Alternatively, the special doped region between the N-well and the P-well is a $P^+$ doped region; a P-type lightly doped source-drain region portion of the special doped region is formed in the N-well by using P-type lightly doped source-drain technology; an N-type halo injection is formed under the P-type lightly doped source-drain region.

The present invention further puts forward a device for electrostatic discharge, wherein the device is a thyristor, the device comprising: an N-well and a P-well, formed on a substrate; an $N^+$ doped region and a $P^+$ doped region, both formed in the N-well and in the P-well; shallow trench isolation, used for isolation between the doped regions; a special doped region, formed between the N-well and the P-well, where shallow trench isolation is used for isolation between the special doped region and the doped regions in the N-well and the P-well, wherein, a lightly doped source-drain region portion of the special doped region is formed in the well with the inverse type of the special doped region by using lightly doped source-drain technology, and a halo injection with the inverse type of the lightly doped source-drain region is formed under the lightly doped source-drain region.

Alternatively, the thyristor is composed of a PNP and an NPN bipolar transistor; the $N^+$ doped region in the N-well is the base of the PNP transistor and the collector of the NPN transistor; the $P^+$ doped region in the P-well is the base of the NPN transistor and the collector of the PNP transistor; the $P^+$ doped region in the N-well is the emitter of the PNP transistor, and the $N^+$ doped region in the P-well is the emitter of the NPN transistor.

Alternatively, the special doped region between the N-well and the P-well is an $N^+$ doped region; an N-type lightly doped source-drain region portion of the special doped region is formed in the P-well by using N-type lightly doped source-drain technology; a P-type halo injection is formed under the N-type lightly doped source-drain region.

Alternatively, the special doped region between the N-well and the P-well is a $P^+$ doped region; a P-type lightly doped source-drain region portion of the special doped region is formed in the N-well by using P-type lightly doped source-drain technology; an N-type halo injection is formed under the P-type lightly doped source-drain region.

Comparing with the existing devices for electrostatic discharge and the methods of manufacturing, the present invention lowers the trigger voltage of the whole device through the reduction of the reverse conduction voltage of the PN junction which is realized by forming the special doped region; forming lightly doped source-drain region portion of the special doped region via lightly doped source-drain technology; and forming a halo injection under the lightly doped source-drain portion to change the position of the PN junction in the device, in this way to avoid the damage of the integrated circuit chip caused by electrostatic discharge due to high trigger voltage in the conventional devices.

DETAILED DESCRIPTION OF THE INVENTION

The method of manufacturing the new device for electrostatic discharge according to the present invention is further detailed in combination with the drawings and the embodiments.

Figure 1:
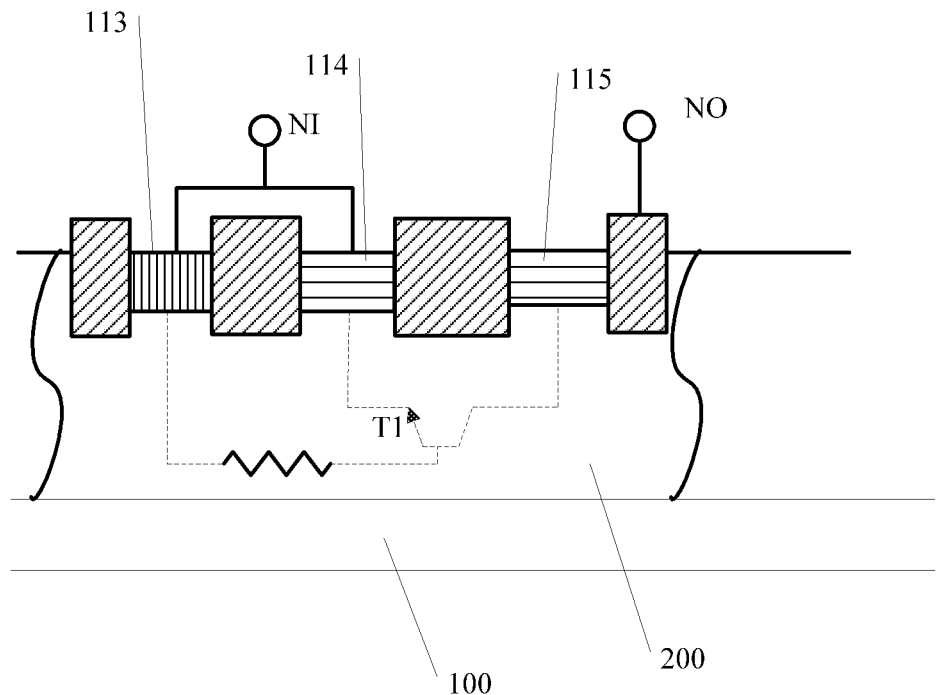
FIG. 1 and FIG. 2 are schematic views of the structure of a bipolar transistor and a thyristor in the prior art.
Figure 2:
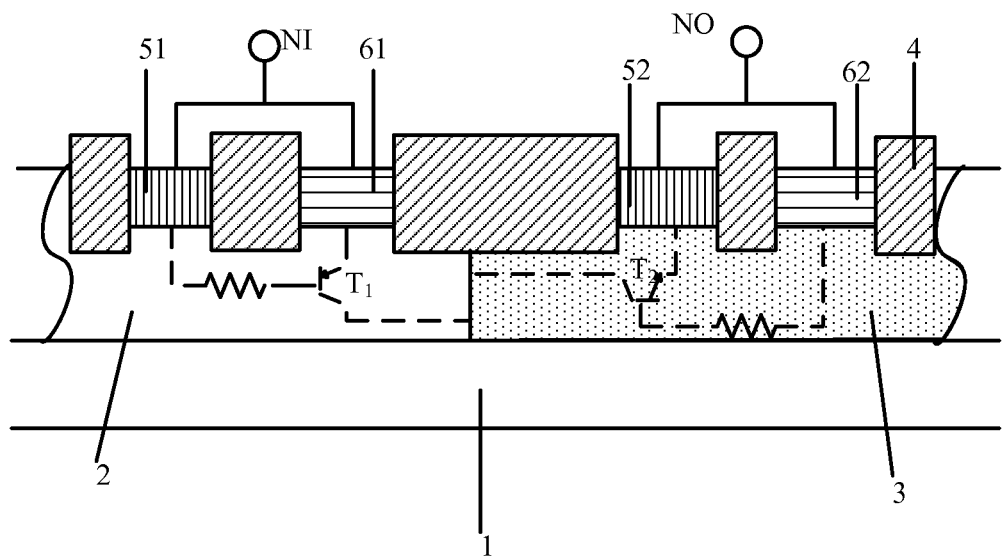
Figure 3:
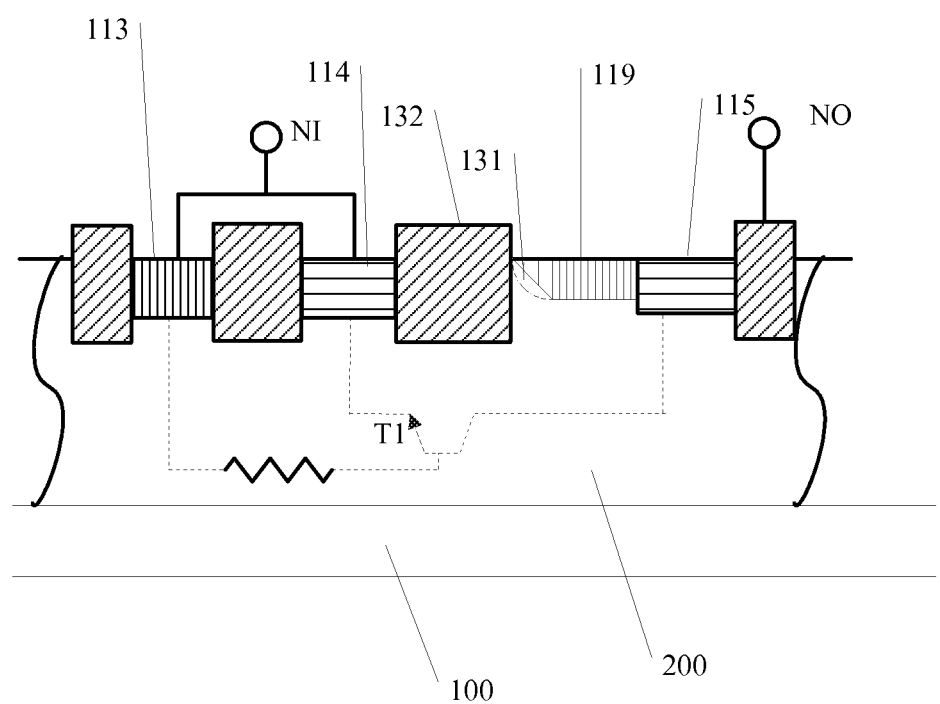
FIG. 3 is the schematic view of the structure of the bipolar transistor used for electrostatic discharge in the first embodiment of the present invention.

Firstly, refer to FIG. 3, it shows the schematic view of the structure of the bipolar transistor for electrostatic discharge in the first embodiment of the present invention. A P-well 200 is formed on the substrate 100. A first $N^+$ doped region 115, a second $N^+$ doped region 114 and a $P^+$ doped region 113 are formed in the P-well 200. The second $N^+$ doped region 114 is located in between the first $N^+$ doped region 115 and the $P^+$ doped region 113. Both ends of each doped region adopt shallow trench isolation 132 for isolation. Between the first $N^+$ doped region 115 and the shallow trench isolation 132 connected with this region, a lightly doped source-drain region 119 is formed by using the lightly doped source-drain technology. The method of manufacturing adopts Logic Boolean Operations. A halo injection 131 with the inverse type of the lightly doped source-drain region is formed beforehand under the lightly doped source-drain region 119. In real-life manufacturing, this special treatment will not generate any extra process cost. One only needs to add the part of lightly doped source-drain region into the Logic Boolean Operations when making the Photomask of the N-type lightly doped source-drain layer. The P-type halo injection and the N-type lightly doped source-drain share the same layer of Photomask. The PN junction formed by the N-type lightly doped source-drain and P-type halo injection has relatively low breakdown reverse voltage.

The new device is a bipolar transistor, wherein the bipolar transistor is an NPN bipolar transistor, the first $N^+$ doped region 115 is the collector of the NPN transistor, the second $N^+$ doped region 114 is the emitter of the NPN transistor, the $P^+$ doped region 113 is the base of the NPN transistor.

Figure 4:
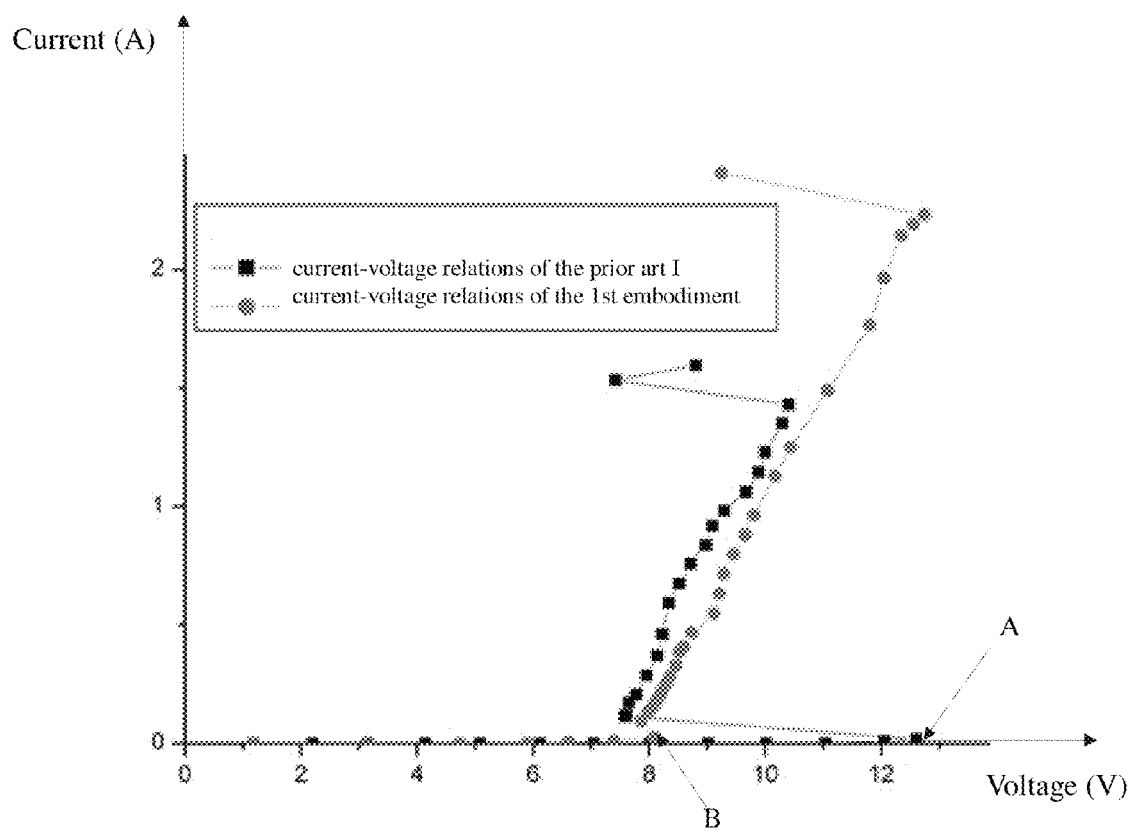
FIG. 4 is the comparison of the current-voltage relations between the prior art I and the first embodiment of the present invention.

FIG. 4 shows the comparison of the current-voltage relations between the prior art I and the first embodiment of the present invention, wherein the x-coordinate is voltage with the unit of Volt (V); the y-coordinate is current with the unit of Ampere (A); the curve connected by small squares in the Figure is the current-voltage relations of the prior art I; the curve connected by small circles is the current-voltage relations of the first embodiment of the present invention. Point A in the Figure is the trigger voltage of the bipolar transistor for the prior art I, about 12.5V. Point B in the Figure is the trigger voltage of the bipolar transistor for the first embodiment of the present invention, about 8V. This shows that, the trigger voltage of the first embodiment of the present invention is much lower than the trigger voltage of the prior art I. The reduction of the trigger voltage of the bipolar transistor can avoid the damage of the integrated circuit chip caused by electrostatic discharge due to high trigger voltage of the conventional bipolar transistor.

Moreover, the second breakdown voltage of the prior art I in FIG. 4 (the second turning point of the curve) is lower than its trigger voltage, thus leading to the non-uniform turn-on of the bipolar transistor. Generally, the bipolar transistor closer to the centre of a multi-agent structure is easier to be triggered to turn on. Once the bipolar transistor is turned on, the voltage rapidly lowers to a point and then slowly rises (as shown in the Figure). When the voltage is increased to the second breakdown voltage, the bipolar transistors nearby cannot be triggered to turn on, because the second breakdown voltage is lower than the trigger voltage of the bipolar transistor, thus incapable of discharging current. Therefore, the only effective bipolar transistor to discharge electrostatic current is the one closer to the centre. In this way, the electrostatic current discharged is only around 1.5A as shown in the figure. Thus, the protective capacity is poor.

When the new bipolar transistor is applied to the same multi-agent structure with the same device width, each bipolar transistor in the multi-agent structure can be triggered to turn on, because the trigger voltage is lower than the second breakdown voltage, so that the electrostatic current is discharged. Therefore, the protective capacity of the new bipolar transistor is much better than the existing structure.

Figure 5:
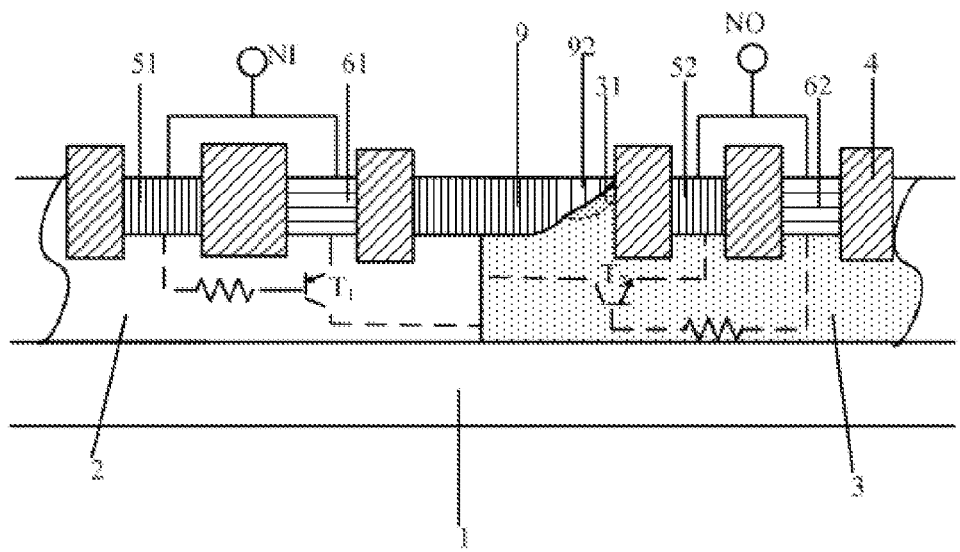
FIG. 5 is the schematic view of the structure of the thyristor used for electrostatic discharge in the second embodiment of the present invention.

Secondly, refer to FIG. 5, which shows the structure of the thyristor used for electrostatic discharge in the second embodiment of the present invention. N-well 2 and P-well 3 are formed on the substrate 1; $N^+$ type doped region 51 as the lead-out region of the N-well 2 is formed on the N-well 2; $P^+$ type doped region 61 as the emitter of the PNP transistor $T_1$ is formed; N-well 2 is as the base of the $T_1$; shallow trench isolation 4 is used to isolate the $N^+$ type doped region 51 and the $P^+$ type doped region 61. $P^+$ doped region 62 as the lead-out region of the P-well 3 is formed on the P-well 3; $N^+$ doped region 52 as the emitter of the NPN transistor $T_2$ is formed; The P-well 3 is as the base of the $T_2$; shallow trench isolation 4 is used to isolate the $P^+$ doped region 62 and $N^+$ doped region 52. The P-well 3 is also as the collector of the $T_1$, and the N-well 2 is also as the collector of the $T_2$. Special doped region 9 is formed between the P-well 3 and the N-well 2, wherein the special doped region 9 uses shallow trench isolation 4 to isolate itself from the $P^+$ doped region 61 in the N-well 2 and the $N^+$ doped region 52 in the P-well 3. In FIG. 5, the special doped region 9 formed is an $N^+$ doped region, then in the well with the inverse type of N, namely in the P-well 3, N-type lightly doped source-drain technology is used to form the N-type lightly doped source-drain region 92 portion of the special doped region 9, wherein the method of manufacturing adopts Logic Boolean Operations. P-type halo injection 31 with the inverse type of the N-type lightly doped source-drain region 92 is formed beforehand under the N-type lightly doped source-drain region 92. In real-life manufacturing, this special treatment will not generate any extra process cost. One only needs to add the part of lightly doped source-drain region into the Logic Boolean Operations when making the Photomask of the N-type lightly doped source-drain layer. The P-type halo injection and the N-type lightly doped source-drain share the same layer of Photomask.

Figure 6:
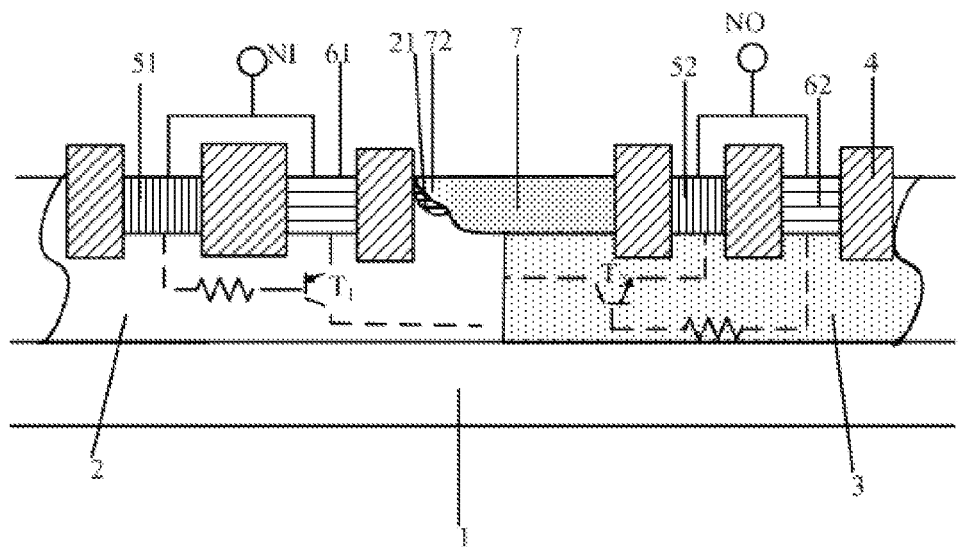
FIG. 6 is the schematic view of the structure of the thyristor used for electrostatic discharge in the third embodiment of the present invention.

Please refer to FIG. 6, which shows the structure of the thyristor used for electrostatic discharge in the third embodiment of the present invention. In this embodiment, the special doped region 7 is formed between the P-well 3 and N-well 2. The special doped region 7 adopts shallow trench isolation 4 to isolate itself from the $P^+$ doped region 61 in the N-well 2 and the $N^+$ doped region 52 in the P-well 3. In FIG. 6, the special doped region 7 formed is a $P^+$ doped region, then in the well with the inverse type of P, namely in the N-well 2, P-type lightly doped source-drain technology is used to form P-type lightly doped source-drain region 72 portion of the special doped region 7, wherein the method of manufacturing adopts Logic Boolean Operations. N-type halo injection 21 with the inverse type of the P-type lightly doped source-drain region 72 is formed beforehand under the P-type lightly doped source-drain region 72. In real-life manufacturing, this special treatment will not generate any extra process cost. One only needs to add the part of lightly doped source-drain region into the Logic Boolean Operations when making the Photomask of the P-type lightly doped source-drain layer. The N-type halo injection and the P-type lightly doped source-drain share the same layer of Photomask.

In FIG. 5 or 6, the PN junction formed by the lightly doped source-drain region 92/72 and the halo injection 31/21 of inverse type has relatively low reverse breakdown voltage.

Figure 7:
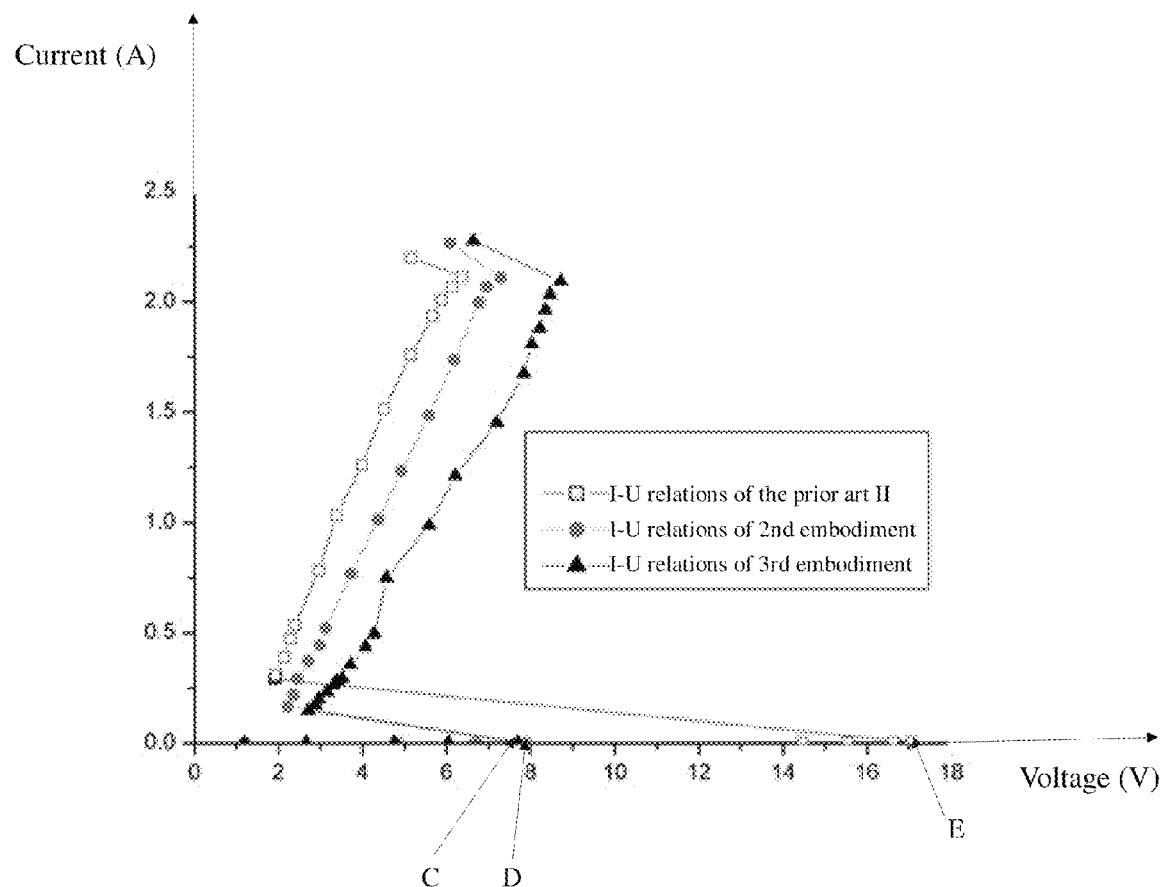
FIG. 7 is the comparison of the current-voltage relations between the prior art II and the second, third embodiments of the present invention.

FIG. 7 shows the comparison of current-voltage relations between the prior art II and the second, third embodiments of the present invention, wherein the x-coordinate is voltage with the unit of Volt (V); y-coordinate is current with the unit of Ampere (A); the curve connected by small squares in the Figure is the current-voltage relations of the prior art II; the curve connected by small circles is the current-voltage relations of the second embodiment of the present invention; the curve connected by small triangles is the current-voltage relations of the third embodiment of the present invention. Point E in the Figure is the trigger voltage of the thyristor in the prior art II, about 17V. Point C in the Figure is the trigger voltage of the thyristor of the second embodiment. Point D is the trigger voltage of the thyristor of the third embodiment. The voltages of point C and point D are of similar values, both about 8V. It shows that, the trigger voltage of the second and third embodiments of the present invention is much lower than the trigger voltage of the prior art II. The reduction of the trigger voltage of the thyristor can avoid the damage of the integrated circuit chip caused by electrostatic discharge due to high trigger voltage of the conventional thyristor.

Although the present invention is disclosed by the preferred embodiments above, they do not constitute restriction to the present invention. Those skilled in this art may make various modifications and improvements within the spirit and scope of the present invention. Therefore, the extent of protection for the present invention shall be subject to the claims.

What is claimed is:
1. A method of manufacturing a thyristor, the method comprising:
  forming a first well of a first conductivity type and a second well of a second conductivity type in a substrate;

forming a first doped region of the second conductivity type in the first well and forming a second doped region of the first conductivity type in the second well;

forming a halo implantation region of the second conductivity type in the second well, the halo implantation region being located between the first and second doped regions;

forming, between the first and second doped regions, a special doped region of the first conductivity type comprising a heavily doped portion and a lightly doped portion, the lightly doped portion being located above and connected to the halo implantation region; and isolating the heavily doped portion from the first doped region by a first shallow trench isolation and isolating the lightly doped portion and the halo implantation region from the second doped region by a second shallow trench isolation, the second shallow trench isolation being in contact with at least a portion of each of the lightly doped portion and the halo implantation region, wherein the halo implantation region and the lightly doped portion are formed by using a same photomask.

2. The method according to claim 1, further comprising:

forming a third doped region of the first conductivity type in the first well, the third doped region providing a base, the second well a collector and the first doped region an emitter of a first parasitic transistor; and forming a fourth doped region of the second conductivity type in the second well, the fourth doped region providing a base, the first well a collector and the second doped region an emitter of a second parasitic transistor.

3. The method according to claim 2, wherein:

the first conductivity type is N type and the second conductivity type is P type;

the first parasitic transistor is a PNP transistor, the base and the emitter of the first parasitic transistor together forming an ESD input node of the thyristor; and the second parasitic transistor is an NPN transistor, the base and the emitter of the second parasitic transistor together forming an ESD output node of the thyristor.

4. The method according to claim 2, wherein:

the first conductivity type is P type and the second conductivity type is N type;

the first parasitic transistor is an NPN transistor, the base and the emitter of the first parasitic transistor together forming an ESD output node of the thyristor; and the second parasitic transistor is a PNP transistor, the base and the emitter of the second parasitic transistor together forming an ESD input node of the thyristor.

* * * * *